United States Patent [19]

Tamaki et al.

[11] Patent Number: 4,729,965
[45] Date of Patent: Mar. 8, 1988

[54] METHOD OF FORMING EXTRINSIC BASE BY DIFFUSION FROM POLYSILICON/SILICIDE SOURCE AND EMITTER BY LITHOGRAPHY

[75] Inventors: Yoichi Tamaki, Kokubunji; Kazuhiko Sagara, Tokyo; Norio Hasegawa, Nishitama; Shinji Okazaki, Urawa; Toshihiko Takakura, Koganei; Hirotaka Nishizawa, Ome, all of Japan

[73] Assignee: Hitachi, Ltd., Tokyo, Japan

[21] Appl. No.: 855,616

[22] PCT Filed: Jul. 31, 1985

[86] PCT No.: PCT/JP85/00432

§ 371 Date: Apr. 9, 1986

§ 102(e) Date: Apr. 9, 1986

[87] PCT Pub. No.: WO86/01338

PCT Pub. Date: Feb. 27, 1986

[30] Foreign Application Priority Data

Aug. 10, 1984 [JP] Japan ................. 59-166355

[51] Int. Cl.[4] .................... H01L 27/12; H01L 21/265
[52] U.S. Cl. .......................... 437/31; 357/34; 357/67; 437/33; 437/162; 437/200; 437/928; 437/931
[58] Field of Search ............ 29/578, 576 B, 590; 148/1.5, 187, 175; 357/67

[56] References Cited

U.S. PATENT DOCUMENTS

| | | | |
|---|---|---|---|
| 4,157,269 | 6/1979 | Ning et al. | 148/1.5 |
| 4,160,991 | 7/1979 | Anantha et al. | 148/188 |
| 4,190,466 | 2/1980 | Bhattacharyya et al. | 148/1.5 |
| 4,408,387 | 10/1983 | Kiriseko | 29/576 B |
| 4,437,897 | 3/1984 | Kemlage | 148/1.5 |
| 4,460,417 | 7/1984 | Murase et al. | 148/187 |
| 4,483,726 | 11/1984 | Issac et al. | 148/187 |
| 4,531,282 | 7/1985 | Sakai et al. | 148/1.5 |
| 4,581,319 | 4/1986 | Wieder et al. | 148/1.5 |
| 4,590,666 | 5/1986 | Goto | 29/578 |

FOREIGN PATENT DOCUMENTS

58-142573 8/1983 Japan.

*Primary Examiner*—Upendra Roy
*Attorney, Agent, or Firm*—Antonelli, Terry & Wands

[57] ABSTRACT

This invention relates to a method of producing a semiconductor device which is suitable for forming a bipolar transistor having less fluctuation of characteristics at a high production yield.

In accordance with the present invention, a graft base (or an extrinsic base) 20 is formed by doping an impurity from a polycrystalline silicon film 13, while an emitter is formed by lithographic technique.

Since the emitter is formed by lithographic technique, the position at which the emitter is to be formed unavoidably changes at the time of mask alignment, but its influence upon transistor characteristics is negligible. Therefore, bipolar transistors having far more uniform characteristics can be formed far more easily than with the method which forms the emitter by self-alignment.

24 Claims, 16 Drawing Figures

METHOD OF FORMING EXTRINSIC BASE BY DIFFUSION FROM POLYSILICON/SILICIDE SOURCE AND EMITTER BY LITHOGRAPHY

TECHNICAL FIELD

This invention relates generally to a method of producing a semiconductor device, and more particularly to a method of easily producing a semiconductor device which is suitable for producing a bipolar semiconductor device having a high packing density.

BACKGROUND ART

Many methods of producing bipolar type semiconductor devices have been proposed to this date in order to improve the operating speed and packing density of the devices, as is well known in the art.

For instance, a method has been proposed which forms a base contact and an emitter by self-alignment so as to improve the packing density (T. Sakai et al, JJAP, vol. 20-1, 155, 1981).

Since the base contact and the emitter can be formed by self-alignment as described above, this method has a characterizing feature in that a bipolar transistor having an extremely small occupying area but having high performance can be obtained without using fine lithography.

However, this method is not without drawbacks, in that the production process is complicated, and bipolar transistors having uniform characteristics cannot be formed easily because the emitter area is likely to vary. Therefore, a method which can be practised more simply and more easily has been desired.

DISCLOSURE OF INVENTION

It is an object of the present invention to provide a method of producing a semiconductor device which eliminates the problems with the prior art methods described above and can produce bipolar semiconductor devices having a high packing density with a high yield.

To accomplish the object described above, the present invention first forms a hole for a base contact at a peripheral portion of a region in which an emitter is to be formed, then forms an emitter hole by lithography at a position spaced apart from the base contact hole by a predetermined distance necessary for securing a high breakdown voltage, and extends an external base consisting of a polycrystalline silicon film or a metal silicide film from the base contact hole to a position below the wiring.

The lithography technique is practised in the following manner, as is well known in the art.

A film whose solubility changes when it is irradiated with light, an electron beam or X-rays (i.e., resist film) is coated on the entire surface of a meaterial to be worked such as a semiconductor substrate, an insulating film, a metal film or a polycrystalline silicon film, and the light, electron beam or X-rays are then radiated selectively to desired portions of the resist film so as to change the solubility of the irradiated portions. If the resist is of a negative type, the solubility of the irradiated portions drops, and if it is of a positive type, the solubility increases.

The portions of the resist film having a high solubility are removed by development, and the exposed portions of the material to be worked are etched.

In this manner, the desired portions of the material to be worked can be selectively etched and a desired pattern can be formed.

The method which radiates light to change the solubility of the resist film is referred to as "photolithography". Similarly, the methods which radiate the electron beam and X-rays are referred to as "electron beam lithography" and "X-ray lithography", respectively.

BEST MODE FOR CARRYING OUT THE INVENTION

EXAMPLE 1

FIGS. 1(a) through 1(f) are process diagrams useful for explaining one embodiment of the present invention.

Figure 1D:
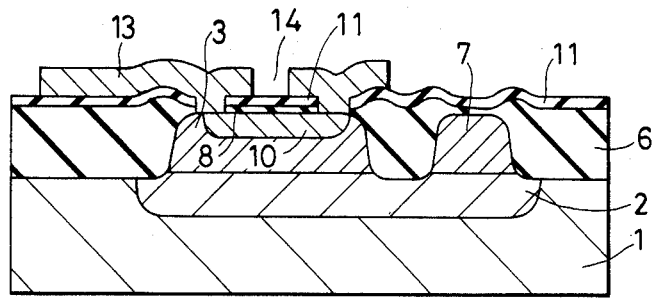
FIG. 1 is a process diagram showing one embodiment of the present invention.
Figure 1E:
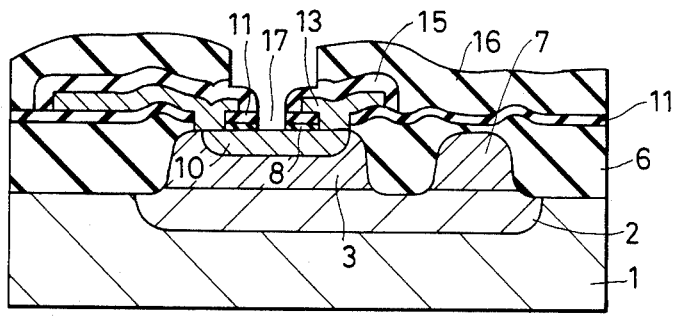
Figure 1F:
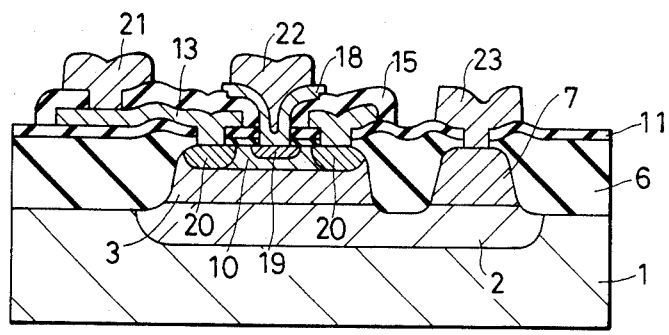
Figure 1A:
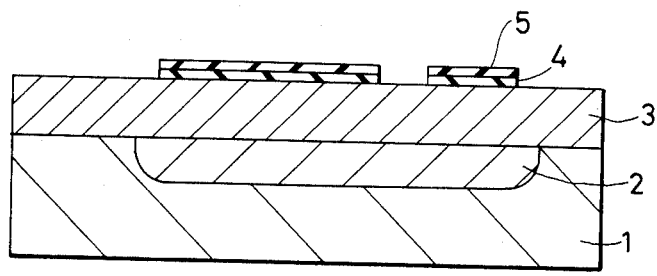

First of all, a collector buried layer 2 having a conductivity type opposite to that of a silicon substrate 1 is formed by knowm methods on the surface of the silicon substrate 1 as shown in FIG. 1(a), and a 1 μm-thick silicon epitaxial layer 3 of a conductivity opposite to that of the silicon substrate 1 is then formed on the substrate surface.

An $SiO_2$ film 4 is formed by thermal oxidation of the surface of the silicon epitaxial layer 3, and an $Si_3N_4$ film 5 is deposited thereon by the known CVD technique. Unnecessary portions are selectively removed by photo-etching, thereby forming isolated patterns consisting of the laminated $Si_3N_4/SiO_2$ films 4, 5.

Figure 1B:
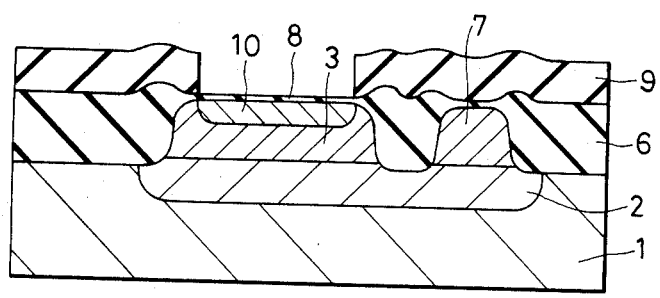

The surface of the exposed portion of the epitaxial layer 3 is removed in a thickness ranging from 0.3 to 0.5 μm by etching, and thermal oxidation treatment is then carried out using the $Si_3N_4$ film 5 described above as a mask, forming an about 1 μm thick isolation oxide film 6 as shown in FIG. 1(b). The remaining $Si_3N_4$ film 5 and $SiO_2$ film 4 are thereafter removed.

After an impurity doped region 7 for an external collector is formed by selectively doping an impurity having the same conductivity type as that of the collector buried layer 2, a 30 to 60 nm-thick silicon dioxide ($SiO_2$) film 8 is formed again by thermal oxidation of the surface of the epitaxial layer 3, and ion implantation is further effected using a resist film 9 as a mask to form a base 10 having the conductivity type opposite to that of the epitaxial layer 3.

Figure 1C:
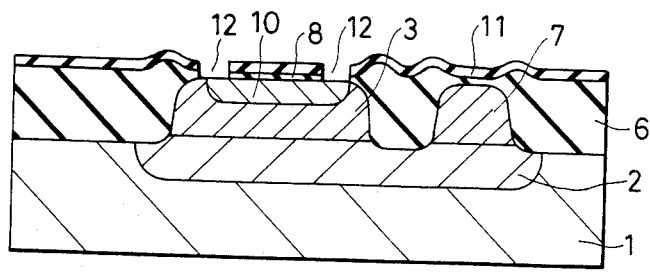

After the resist film 9 is removed, an $Si_3N_4$ film 11 is formed on the entire surface as shown in FIG. 1(c), and desired portions are selectively removed by photo-etching to form a contact hole 12 for external base. In this case, it is possible to employ ordinary photolithography technique using ultraviolet rays, but if the desired portions of the $Si_3N_4$ film 11 are selectively removed by electron beam lithography, an extremely fine contact hole 12 which is below about 0.5 μm wide can be formed.

Next, a polycrystalline silicon film 13 is formed as shown in FIG. 1(d), and an impurity having the same conductivity type as that of the base 10 is doped. Then, the portion at which the emitter is to be formed is selectively etched and removed, an emitter hole 14 is formed. Incidentally, the portions which are not necessary for the external base among the polycrystalline silicon film 13 are simultaneously etched and removed in this case. If the known electron beam lithography is used in the same way as in the case of the contact hole for the external base, an extremely fine emitter hole which is below about 0.5 μm wide can be formed. That is, after a resist film is formed on the entire surface, desired portions are irradiated and then developed, and the exposed polycrystalline silicon film is removed. It is evident that ordinary photolithography can be employed in this treatment.

Next, as shown in FIG. 1(e), the surface of the polycrystalline silicon film 13 is oxidized to form an $SiO_2$ film 15. The exposed portions of the $Si_3N_4$ film and $SiO_2$ film described above are then directionally etched by reactive ion etching using a resist film 16 having a hole slightly larger than the hole 14, thereby forming an emitter contact hole 17.

As shown in FIG. 1(f), a polycrystalline silicon film 18 for forming an emitter, to which large quantities of an impurity having the conductivity type opposite to that of the base is doped, is formed inside the emitter hole 17, and is then heated in order to diffuse the impurity in the polycrystalline silicon film 18 into the base region 10, and thereby to form an emitter 19. In this case, the impurity which is contained in the external base 13 and has the same conductivity as that of the base 10 is simultaneously diffused into the epitaxial layer 3, forming a graft base layer 20 having a high impurity concentration. Therefore, electric connection between the intrinsic base region 10 and the polycrystalline silicon film (external base) can be established reliably.

Finally, a base electrode 21, an emitter electrode 22 and a collector electrode 23 are formed to complete a bipolar transistor.

The variance of the emitter dimension of the bipolar transistors produced in this manner is about 5%. The variance of the emitter dimension in the conventional bipolar transistors produced by use of self-alignment not only for the base contact but also for the emitter is about 30%. Therefore, the present invention can remarkably improve the accuracy of the emitter formation and can stabilize the transistor characteristics.

Since the production process is reduced to about ⅔ by the present invention, producibility and yield can be approximately doubled.

In the present invention, the hole for forming the emitter is formed by lithography as described above.

Therefore, an emitter having a high dimensional accuracy can be formed by a simple process, but positional deviation occurs inevitably at the time of mask alignment.

Figure 2:
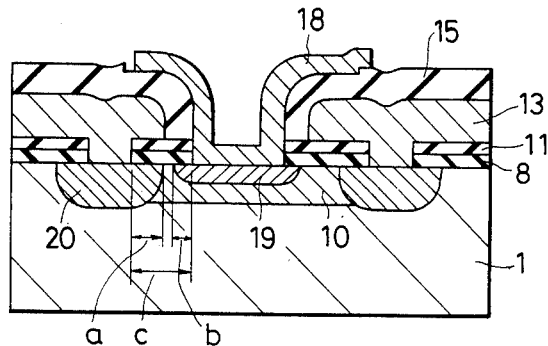
FIGS. 2, 3 and 4 are sectional view, plan view and diagram useful for explaining the positional deviation of an emitter in the present invention, respectively.

FIG. 2 shows the structure of the transistor when the emitter contact hole is formed where the mask is misaligned to the left in relation to the contact hole for the external base, and the emitter 19 misaligned to the left.

The condition in which a problem such as a leakage current does not occur at the base-emitter junction is expressed by the following formula (1) as shown in FIG. 2:

$$c \geq a+b \qquad (1)$$

Where a is the distance from the contact hole for the external base and the end portion of the graft base 20, b is the distance between the emitter contact hole and the end portion of the emitter 19 and c is the distance between the contact hole for the external base and the emitter contact hole.

When a=0.1 μm and b=0.2 μm, for example, the problem described above does not occur if c is at least 0.3 μm. Assuming that the mask alignment error occurring this time is 0.2 μm, there is no posibility that graft base region 20 will come into contact with the emitter 19 if c is at least 0.5 μm.

Another problem resulting from the position deviation at the time of mask alignment is the increase of base resistance.

Figure 3:
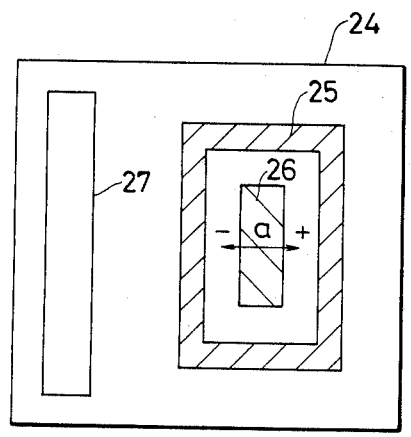
Figure 4:
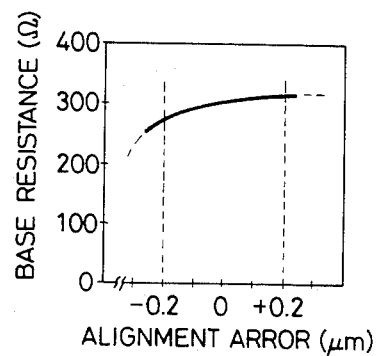

For instance, if the position deviation of the emitter occurs in a transistor having a planar structure shown in FIG. 3, the base resistance fluctuates as shown in FIG. 4.

In FIG. 3, reference numeral 24 represents an isolation pattern, 25 is a pattern for a contact hole for external base, 26 is an emitter hole pattern and 27 is a base contact pattern. The dimension of the emitter hole pattern 26 is 0.7 μm×2.0 μm.

If the alignment error at the time of mask alignment occurs in a direction represented by an arrow a, it is confirmed that the change of the base resistance resulting from the alignment error is within the range +5% to −10% as can be seen clearly from FIG. 4.

Mask alignment accuracy of 0.2 μm can be attained with photolithography using light, but if electron beam lithography is used, the alignment error can be further reduced and the change of the base resistance can be further reduced.

If the distance between the contact hole for external base and the emitter contact hole satisfies the formula (1) above, the occurrence of abnormalities such as leakage current can be prevented and even if the mask alignment error occurs to some extent, the effect upon the transistor characteristics is extremely small, so that a satisfactory bipolar transistor can be formed.

EXAMPLE 2

In Example 1 described above, both the contact hole for the external base and the emitter contact hole are formed by lithography using a mask, but the contact hole for the external base can be formed without using the fine lithographic technique.

Figure 5A:
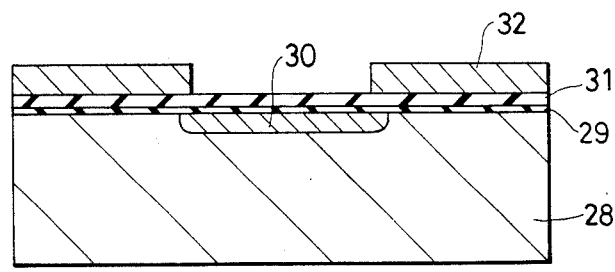
FIG. 5 is a process diagram showing another embodiment of the present invention.

First of all, as shown in FIG. 5(a), an $SiO_2$ film 29 is formed on a silicon substrate 28, and ion implantation is then performed using a photoresist film as a mask to form an intrinsic base region 30.

An $Si_3N_4$ film 31 and a polycrystalline silicon film 32 are sequentially deposited, and an impurity having the same conductivity as that of the base 30 (boron, for example, if the base is of the P type) is doped into the polycrystalline silicon film 32. Thereafter, the polycrystalline silicon film 32 on the base is selectively etched and removed.

Figure 5B:
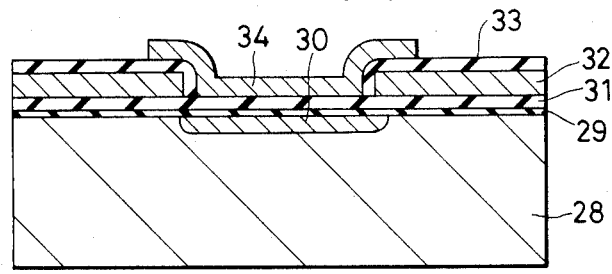
Figure 5C:
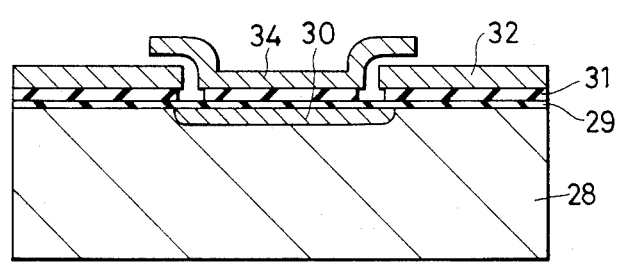

Next, thermal oxidation is carried out to form an $SiO_2$ film 33 on the surface of the polycrystalline silicon film 32 as shown in FIG. 5(b), and a non-doped polycrystalline silicon film 34 to which no impurity is substantially doped is further formed on the $SiO_2$ film 33. The non-doped polycrystalline silicon film 34 is then removed in such a manner as to leave a region which is greater by 0.5 to 1.0 μm than the open portion.

After the $SiO_2$ film 33 is etched and removed using a buffered HF solution, the exposed portion of the $Si_3N_4$ film 31 below the eaves of the non-doped polycrystalline silicon film 34 is etched and removed using hot phosphoric acid.

Figure 5D:
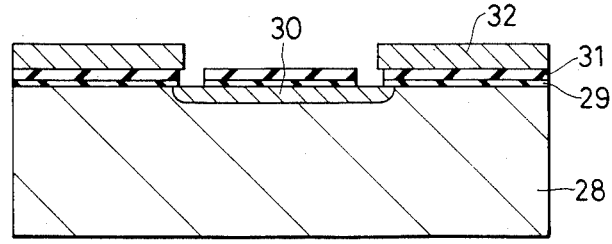

The non-doped polycrystalline silicon film 34 is selectively removed as shown in FIG. 5(d) using an etching solution for etching the non-doped polycrystalline silicon (hydrazine, for example, when the doped impurity is boron) without etching the polycrystalline silicon to which the impurity is doped, and then the exposed portion of the SiO2 film 29 is removed. There is thus formed a contact hole for external base which is from 0.2 to 0.4 μm wide.

Figure 5E:
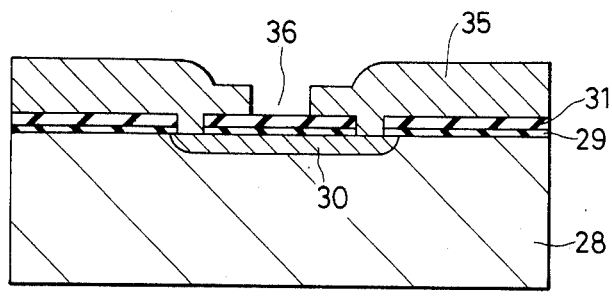

A polycrystalline silicon film 35 is formed on the entire surface as shown in FIG. 5(e), and an impurity having the same conductivity type as the base 30 is doped. Desired portions of the polycrystalline silicon film 35 are selectively removed by known photoetching technique, and an emitter hole 36 is formed.

Figure 5F:
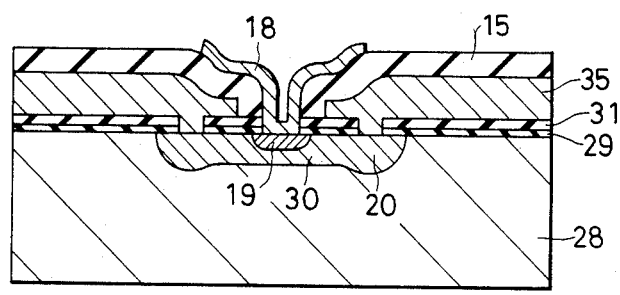

The subsequent steps are the same as those of Example 1. As shown in FIG. 5(f), a polycrystalline silicon film 18 to which large quantities of an impurity having a conductivity type opposite to that of the base 30 is doped is formed in such a manner as to cover at least the emitter hole 36, and heating is then performed to form an emitter 19 and a graft base 20.

A protective film and wirings are thereafter formed by a known method to complete a bipolar transistor.

It is confirmed that this example, too, can provide the same transistor characteristics as those of Example 1.

EXAMPLE 3

Figure 6:
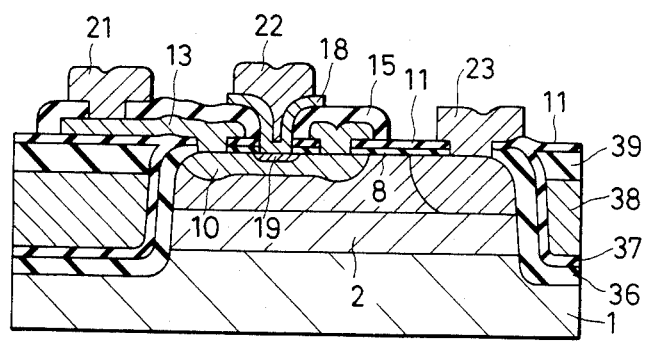
FIG. 6 is a sectional view showing still another embodiment of the present invention.

This example aims to isolate the bipolar transistors, which are formed in accordance with Example 1 or 2, by use of a groove having a U-shaped cross-section. The cross-sectional structure is shown in FIG. 6.

In other words, this example packs SiO2 films 36, 39, an Si3N4 film 37 and a polycrystalline silicon film 38 into the groove formed in the device isolation region so as to isolate the devices (transistors) from each other. This example is particularly effective for reducing the necessary area and parasitic capacitance.

In the examples given above, polycrystalline silicon is used for the external base, but silicides of various metals such as W, Mo, Ni, and the like, can be used, and the base resistance can be further reduced by so doing. This holds true also of polycrystalline silicon used for the emitter diffusion, and good results can be obtained by use of silicides of various metals. In either case, extremely satisfactory results can be obtained if heating is carried out while a polycrystalline silicon layer is interposed between the semiconductor substrate and the silicide layer. The emitter can of course be formed by ion implantation in place of thermal diffusion.

INDUSTRIAL APPLICABILITY

The present invention can easily and simply form an emitter having a high dimensional accuracy, and can therefor obtain a far higher yield than the conventional production methods which form the base contact and the emitter by the self-alignment method.

Since the emitter is formed by ordinary lithographic technique, a positional error at the time of mask alignment occurs inevitably, but the effect resulting from the positional error upon the transistor characteristics is negligible, and bipolar transistors having high performance can be produced stably and with high producibility.

What is claimed is:

1. A method of producing a semiconductor device comprising the following steps:
    (a) forming a mask having a hole at a position at which a base is to be formed, on the surface of a semiconductor substrate;
    (b) doping an impurity having a first conductivity type into the surface region of said semiconductor substrate through said hole of said mask to form said base;
    (c) forming an insulating film having a hole at a position at which an external base is to be formed, said insulating film being formed on at least said base;
    (d) forming at least a polycrystalline silicon film into which an impurity having said first conductivity type is doped, or forming a metal silicide film, on the entire surface, including on said insulating film on at least said base;
    (e) forming a resist film on the entire surface of said polycrystalline silicon or metal silicide film, and selectively changing the solubility or a desired portion of said resist film;
    (f) removing the portion of said resist film having a high solubility by development, and removing the exposed portion of said polycrystalline silicon or metal silicide film, thereby exposing a portion of the insulating film;
    (g) oxidizing the surface of said polycrystalline silicon or metal silicide film, leaving at least a remaining portion of the polycrystalline silicon film or metal silicide film as polycrystalline silicon or metal silicide, respectively; and
    (h) removing the exposed portion of said insulating film to form a hole, and doping an impurity having a second conductivity type opposite to said first conductivity type into a desired portion of the surface region of said base to form an emitter.

2. The method of producing a semiconductor device as defined in claim 1 wherein a metal silicide film is formed in said step (d).

3. The method of producing a semiconductor device as defined in claim 1 wherein the change of solubility of said resist film is effected by irradiation with light in said step (e).

4. The method of producing a semiconductor device as defined in claim 1 wherein the charge of solubility of said resist film is effected by irradiation with an electron beam.

5. The method of producing a semiconductor device as defined in claim 1 wherein the change of solubility of said resist film is effected by irradiation with X-rays.

6. The method of producing a semiconductor device as defined in claim 1 wherein a graft base is formed together with said emitter in said step (h).

7. The method of producing a semiconductor device as defined in claim 1 wherein said emitter is formed by doping from polycrystalline silicon film or a metal silicide film in said step (h).

8. The method of producing semiconductor device as defined in claim 1 wherein said emitter is formed by ion implantation in said step (h).

9. The method of producing a semiconductor device as defined in claim 1 wherein a polycrystalline silicon film is formed in step (d).

10. The method of producing a semiconductor device as defined in claim 1 wherein the hole in the insulating film formed in said step (c) is formed at the periphery of the base.

11. The method of producing a semiconductor device as defined in claim 1 wherein in removing the exposed portion of said insulating film in said step (h) a remaining portion of said insulating film is left on said substrate.

12. The method of producing a semiconductor device as defined in claim 1 wherein said insulating film formed in said step (c) comprises a first film of silicon dioxide formed on at least said base and a second film of silicon nitride formed on said first film.

13. The method of producing a semiconductor device as defined in claim 1 including the further step of forming an oxide film on the substrate at the location of the base, prior to the step of forming the mask having a hole at a position at which a base is to be formed.

14. The method of producing a semiconductor device as defined in claim 1 wherein a graft base is formed together with said emitter in said step (l').

15. The method of producing a semiconductor device as defined in claim 9 wherein said polycrystalline silicon film is formed in said step (d), and is formed in said hole in the insulating film formed in step (c), at the position at which the external base is to be formed, so as to contact the base, and wherein said step (h) includes the substeps of forming a further polycrystalline film doped with said impurity of the second conductivity type in the hole formed in step (h) and then heating the formed structure so as to diffuse impurity from the polycrystalline film formed in step (d) and from said further polycrystalline silicon film into the substrate, whereby a graft base and said emitter are respectively formed.

16. The method of producing a semiconductor device as defined in claim 13 wherein said oxide film forms part of said insulating film, with a hole, at the location at which the external base is to be formed, being provided in said oxide film during said step (c).

17. A method of producing a semiconductor device comprising the following steps:
(a') forming a silicon dioxide film on a surface of a semiconductor substrate, and then doping an impurity having a first conductivity type into a desired portion of the surface region of said semiconductor substrate to form a base;
(b') forming a silicon nitride film on the entire surface, and laminating thereon a polycrystalline silicon film into which an impurity of said first conductivity type is doped and which has a hole on said base;
(c') oxidizing the surface of said polycrystalline silicon film;
(d') forming a polycrystalline silicon film, into which no impurity is substantially doped, on the entire surface, and then removing an undesired portion of said polycrystalline silicon film into which no impurity is substantially doped;
(e') removing said silicon dioxide film formed by oxidation in said step (c');
(f') removing the exposed portion of said silicon nitride film;
(g') removing said polycrystalline silicon film, into which no impurity is substantially doped, and said silicon dioxide film exposed by said step (f');
(h') forming at least a polycrystalline silicon film into which an impurity having said first conductivity type is doped, or forming a metal silicide film, on the entire surface, including on said silicon nitride film on at least said base;
(i') forming a resist film on the entire surface of said polycrystalline silicon or metal silicide film, and selectively changing the solubility of a desired portion of said resist film;
(j') removing the portion of said resist film having a high solubility by development, and removing the exposed portion of said polycrystalline silicon or metal silicide film, thereby exposing a portion of the silicon nitride film;
(k') oxidizing the surface of said polycrystalline silicon or metal silicide film, leaving at least a remaining portion of the polycrystalline silicon film or metal silicide film as polycrystalline silicon or metal silicide, respectively; and
(l') removing the exposed portion of said silicon nitride film to expose the silicon dioxide film, and removing the exposed silicon dioxide film to form a hole, and doping an impurity having a second conductivity type opposite to said first conductivity type into a desired portion of the surface region of said base to form an emitter.

18. The method of producing a semiconductor device as defined in claim 17 wherein a metal silicide film is formed on the entire surface.

19. The method of producing a semiconductor device as defined in claim 17 wherein the change of solubility of said resist film is effected by irradiation with light in said step (i').

20. The method of producing a semiconductor device as defined in claim 17 wherein the change of solubility of said resist film is effected by irradiation with an electron beam in said step (i').

21. The method of producing a semiconductor device as defined in claim 17 wherein the change of solubility of said resist film is effected by irradiation with X-rays in said step (i').

22. The method of producing a semiconductor device as defined in claim 17 wherein said emitter is formed by doping from said polycrystalline silicon film or a metal silicide film in said step (l').

23. The method of producing a semiconductor device as defined in claim 17 wherein said emitter is formed by ion implantation in said step (l').

24. The method of producing a semiconductor device as defined in claim 17 wherein in removing the exposed portions of the silicon nitride film and the silicon dioxide film to form said hole in step (l') a remaining portion of each of the silicon nitride and silicon dioxide films are retained on the substrate.

* * * * *